(12) United States Patent
Okumura et al.

(10) Patent No.: US 6,830,653 B2
(45) Date of Patent: Dec. 14, 2004

(54) PLASMA PROCESSING METHOD AND APPARATUS

(75) Inventors: Tomohiro Okumura, Kadoma (JP); Yukihiro Maegawa, Ibaraki (JP); Izuru Matsuda, Ibaraki (JP); Takayuki Kai, Katano (JP); Mitsuo Saitoh, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 169 days.

(21) Appl. No.: 10/207,183

(22) Filed: Jul. 30, 2002

(65) Prior Publication Data

US 2003/0026920 A1 Feb. 6, 2003

Related U.S. Application Data

(63) Continuation-in-part of application No. 09/968,810, filed on Oct. 3, 2001.

(30) Foreign Application Priority Data

| Oct. 3, 2000 | (JP) | ......................................... 2000-303334 |
| Apr. 4, 2001 | (JP) | ......................................... 2001-105442 |
| Jul. 31, 2001 | (JP) | ......................................... 2001-231433 |

(51) Int. Cl.[7] .......................... C23C 16/00; H01L 21/00
(52) U.S. Cl. ............................. 156/345.48; 118/723 AN
(58) Field of Search ....................... 156/345.48, 345.49; 118/723 I, 723 IR, 723 AN; 315/111.51

(56) References Cited

U.S. PATENT DOCUMENTS 5,716,451 A * 2/1998 Hama et al. ............... 118/723 I
6,071,372 A * 6/2000 Ye et al. ................. 156/345.48
6,355,573 B1 * 3/2002 Okumura et al. ........... 438/709

FOREIGN PATENT DOCUMENTS

JP        2000-243707       *   9/2000

* cited by examiner

*Primary Examiner*—Luz Alejandro-Mulero
(74) *Attorney, Agent, or Firm*—Wenderoth, Lind & Ponack, L.L.P.

(57) ABSTRACT

A plasma processing method for generating plasma in a vacuum chamber and processing a substrate placed on a substrate electrode, the plasma being generated by supplying a high-frequency power having a frequency of 50 MHz to 3 GHz to an antenna provided opposite to the substrate electrode while interior of the vacuum chamber is controlled to a specified pressure by supplying a gas into the vacuum chamber and exhausting the interior of the vacuum chamber, the method includes with a dielectric plate being sandwiched between the antenna and the vacuum chamber and both the antenna and the dielectric plate projecting into the vacuum chamber, controlling plasma distribution on the substrate with an annular and recessed slit provided between the antenna and the vacuum chamber, and processing the substrate in a state where the antenna cover is fixed by making both an inner side face of the slit and the antenna covered with an antenna cover, making a bottom face of the slit covered with a slit cover, supporting the antenna cover by the slit cover, and fixing the slit cover to a wall surface of the vacuum chamber.

6 Claims, 4 Drawing Sheets

PLASMA PROCESSING METHOD AND APPARATUS

This is a continuation-in-part of Ser. No. 09/968,810, filed Oct. 3, 2001.

BACKGROUND OF THE INVENTION

The present invention relates to a plasma processing method and apparatus to be used for manufacture of semiconductor or other electron devices and micromachines.

In the manufacture of semiconductor or other electron devices and micromachines, thin-film processing techniques using plasma processing have been becoming increasingly important in recent years.

As an example of conventional plasma processing methods, plasma processing using a patch-antenna type plasma source is described below with reference to FIG. 5. Referring to FIG. 5, while interior of a vacuum chamber 1 is maintained to a specified pressure by introducing a specified gas from a gas supply unit 2 into the vacuum chamber 1 and simultaneously performing exhaustion by a turbo-molecular pump 3 as an exhauster, a high-frequency power of 100 MHz is supplied by an antenna use high-frequency power supply 4 to an antenna 5 provided so as to project into the vacuum chamber 1. Then, plasma is generated in the vacuum chamber 1, allowing plasma processing to be carried out with a substrate 7 placed on a substrate electrode 6. There is also provided a substrate-electrode use high-frequency power supply 8 for supplying high-frequency power to the substrate electrode 6, making it possible to control ion energy that reaches the substrate 7. The high-frequency voltage supplied to the antenna 5 is delivered to a proximity to the center of the antenna 5 by a feed bar 9. A plurality of sites of the antenna 5 other than its center and peripheries, and a face 27 of the vacuum chamber 1 opposite to the substrate 7 are short-circuited by short pins 10. A dielectric plate 11 is sandwiched between the antenna 5 and the vacuum chamber 1, and the feed bar 9 and the short pins 10 serve to connect the antenna 5 and the antenna use high-frequency power supply 4 to each other, and the antenna 5 and the vacuum chamber 1 to each other via through holes provided in the dielectric plate 11. Also, surfaces of the antenna 5 are covered with an antenna cover 15. The antenna cover 15 is fixed to the antenna 5 by bolts 25. Further, a slit 14 is provided so as to comprise a recessed or grooved space between the dielectric plate 11 and a dielectric ring 12 provided at a peripheral portion of the dielectric plate 11, and a recessed or grooved space between the antenna 5 and a conductor ring 13 provided at a peripheral portion of the antenna 5.

The turbo-molecular pump 3 and an exhaust port 19 are disposed just under the substrate electrode 6, and a pressure-regulating valve 20 for controlling the vacuum chamber 1 to a specified pressure is an up-and-down valve disposed just under the substrate electrode 6 and just over the turbo-molecular pump 3. The substrate electrode 6 is fixed to the vacuum chamber 1 with four pillars 21.

In the plasma processing described in the above prior-art example, however, plasma density would become the highest at the slit, posing an issue of damage of a bottom face 26 of the slit. The vacuum chamber, which is typically made of aluminium, is generally coated with anodic oxide (alumite) for prevention of corrosion of the inner wall surface of the vacuum chamber. However, the alumite of the slit bottom face would be damaged and, over repeated plasma processing, the alumite would become gradually thinner and thinner. According to our experiments, when the thickness of alumite was measured before and after an about 1,000 pcs. etching process, an about 10 µm decrease of film thickness was found. Shortage of the alumite thickness would lead to problems such as corrosion of base-material aluminium or occurrence of dust. For prevention of this, it is necessary to disassemble most of the plasma source unit and replace the aluminium member, which is heavy and expensive, unfortunately. Furthermore, since the antenna cover 15 is fixed to the antenna 5 by the bolts 25, deposited film resulting from the plasma processing tends to be peeled off from the vicinities of the bolts 25, causing occurrence of dust, as another problem.

Meanwhile, in the plasma processing described in the prior-art example, there is an issue that the temperature of the antenna cover 15 increases due to plasma exposure. Since the antenna cover 15 and the antenna 5 are vacuum-insulated from each other, the temperature of the antenna cover 15 gradually increases over repeated plasma processing. According to our experiments, it was found that the temperature of the antenna cover 15 increases up to 170° C. after 5-min. plasma processing and 1-min. vacuum holding is repeated six times. Such an abrupt change in the temperature of the antenna cover 15 may cause not only occurrence of dust but also cracks of the antenna cover 15.

In view of these and other prior-art issues, an object of the present invention is to provide a plasma processing method and apparatus which is less liable to occurrence of dust and cracks of the antenna cover.

SUMMARY OF THE INVENTION

In accomplishing these and other aspects, according to a first aspect of the present invention, there is provided a plasma processing method for generating plasma in a vacuum chamber and processing a substrate placed on a substrate electrode, the plasma being generated by supplying a high-frequency power having a frequency of 50 MHz to 3 GHz to an antenna provided opposite to the substrate electrode while interior of the vacuum chamber is controlled to a specified pressure by supplying a gas into the vacuum chamber and exhausting the interior of the vacuum chamber, the method comprising: with a dielectric plate being sandwiched between the antenna and the vacuum chamber and both the antenna and the dielectric plate projecting into the vacuum chamber, controlling plasma distribution on the substrate with an annular and recessed slit provided between the antenna and the vacuum chamber; and processing the substrate in a state where the antenna cover is fixed by making both an inner side face of the slit and the antenna covered with an antenna cover, making a bottom face of the slit covered with a slit cover, supporting the antenna cover by the slit cover, and fixing the slit cover to a wall surface of the vacuum chamber.

According to a second aspect of the present invention, there is provided a plasma processing method according to the first aspect, wherein the substrate is processed with the slit cover is a conductor and with electric conduction between the slit cover and the vacuum-chamber wall surface ensured by a spiral tube.

According to a third aspect of the present invention, there is provided a plasma processing method according to the first aspect, wherein the substrate is processed with the slit cover is an insulating member.

According to a fourth aspect of the present invention, there is provided a plasma processing method for generating plasma in a vacuum chamber and processing a substrate placed on a substrate electrode within the vacuum chamber, the plasma being generated by supplying a high-frequency power having a frequency of 50 MHz to 3 GHz to an antenna provided opposite to the substrate electrode while interior of the vacuum chamber is controlled to a specified pressure by supplying a gas into the vacuum chamber and exhausting the interior of the vacuum chamber, the method comprising: with a dielectric plate being sandwiched between the antenna and the vacuum chamber and both the antenna and the dielectric plate projecting into the vacuum chamber, controlling plasma distribution on the substrate by an annular and recessed slit provided between the antenna and the vacuum chamber; and processing the substrate while controlling temperature of the antenna by making both an inner side face of the slit and the antenna covered with an antenna cover and applying a refrigerant flow to the antenna while ensuring heat conduction between the antenna and the antenna cover by a heat-conducting sheet provided between the antenna and the antenna cover.

According to a fifth aspect of the present invention, there is provided a plasma processing method according to the fourth aspect, wherein the substrate is processed while the temperature of the antenna is controlled with the heat-conducting sheet being made from a resin having elasticity and having a dielectric loss tangent of more than 0 and not more than 0.01.

According to a sixth aspect of the present invention, there is provided a plasma processing method according to the fourth aspect, wherein the substrate is processed while the temperature of the antenna is controlled with the heat-conducting sheet having a thickness of 0.03 mm to 3 mm.

According to a seventh aspect of the present invention, there is provided a plasma processing method according to the first aspect, wherein the antenna cover is made of 1 mm to 10 mm thick quartz glass.

According to an eighth aspect of the present invention, there is provided a plasma processing method according to the first aspect, wherein the substrate is processed with the antenna cover being made of 1 mm to 10 mm thick insulative silicon.

According to a ninth aspect of the present invention, there is provided a plasma processing method according to the first aspect, wherein the substrate is processed with the frequency of the high-frequency power supplied to the antenna being within a range of 50 MHz to 300 MHz.

According to a 10th aspect of the present invention, there is provided a plasma processing apparatus comprising:

a vacuum chamber;

a gas supply unit for supplying gas into the vacuum chamber;

an exhausting unit for exhausting interior of the vacuum chamber;

a pressure-regulating valve for controlling the interior of the vacuum chamber to a specified pressure;

a substrate electrode for placing thereon a substrate within the vacuum chamber;

an antenna provided opposite to the substrate electrode; and high-frequency power supply capable of supplying a high-frequency power having a frequency of 50 MHz to 3 GHz to the antenna, the plasma processing apparatus further comprising:

a dielectric plate sandwiched between the antenna and the vacuum chamber, both the antenna and the dielectric plate projecting into the vacuum chamber;

an antenna cover for covering both an inner side face of an annular and recessed slit and the antenna with the slit provided between the antenna and the vacuum chamber; and a slit cover for covering a bottom face of the slit and supporting the antenna cover, where the slit cover is fixed to a wall surface of the vacuum chamber so that the antenna cover is fixed.

According to an 11th aspect of the present invention, there is provided a plasma processing apparatus according to the 10th aspect, wherein the slit cover is a conductor and electric conduction between the slit cover and the vacuum-chamber wall surface is ensured by a spiral tube.

According to a 12th aspect of the present invention, there is provided a plasma processing apparatus according to the 10th aspect, wherein the slit cover is a dielectric substance.

According to a 13th aspect of the present invention, there is provided a plasma processing apparatus comprising:

a vacuum chamber;

a gas supply unit for supplying gas into the vacuum chamber;

an exhausting unit for exhausting interior of the vacuum chamber;

a pressure-regulating valve for controlling the interior of the vacuum chamber to a specified pressure;

a substrate electrode for placing thereon a substrate within the vacuum chamber;

an antenna provided opposite to the substrate electrode; and high-frequency power supply capable of supplying a high-frequency power having a frequency of 50 MHz to 3 GHz to the antenna, the plasma processing apparatus further comprising:

a dielectric plate sandwiched between the antenna and the vacuum chamber, both the antenna and the dielectric plate projecting into the vacuum chamber;

an antenna cover for covering both an inner side face of an annular and recessed slit and the antenna with the slit provided between the antenna and the vacuum chamber;

a heat-conducting sheet provided between the antenna and the antenna cover; and a refrigerant feed unit for making a refrigerant flow to the antenna.

According to a 14th aspect of the present invention, there is provided a plasma processing apparatus according to the 13th aspect, wherein the heat-conducting sheet is made from a resin having elasticity and having a dielectric loss tangent of more than 0 and not more than 0.01.

According to a 15th aspect of the present invention, there is provided a plasma processing apparatus according to the 13th aspect, wherein the heat-conducting sheet has a thickness of 0.03 mm to 3 mm.

According to a 16th aspect of the present invention, there is provided a plasma processing apparatus according to the tenth aspect, wherein the antenna cover is made of 1 mm to 10 mm thick quartz glass.

According to a 17th aspect of the present invention, there is provided a plasma processing apparatus according to the tenth aspect, wherein the antenna cover is made of 1 mm to 10 mm thick insulative silicon.

According to an 18th aspect of the present invention, there is provided a plasma processing apparatus according to the tenth aspect, wherein the frequency of the high-frequency power supplied to the antenna is within a range of 50 MHz to 300 MHz.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
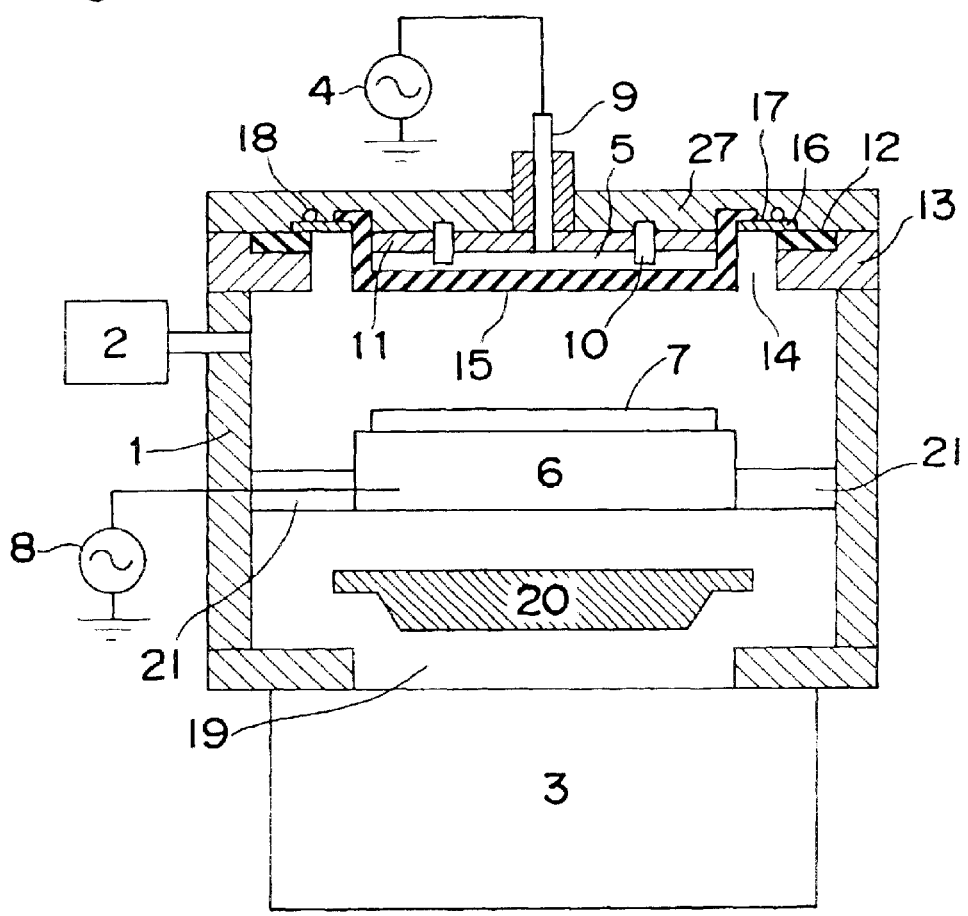
FIG. 1 is a sectional view showing constitution of a plasma processing apparatus used in a first embodiment of the present invention.

Before the description of the present invention proceeds, it is to be noted that like parts are designated by like reference numerals throughout the accompanying drawings.

Hereinbelow, a first embodiment of the present invention is described with reference to FIGS. 1 and 2.

FIG. 1 shows a sectional view of a plasma processing apparatus, used in the first embodiment of the present invention, on which a patch-antenna system plasma source is mounted. Referring to FIG. 1, while interior of a vacuum chamber 1 is maintained to a specified pressure by introducing a specified gas from a gas supply unit 2 into the vacuum chamber 1 and simultaneously performing exhaustion by a turbo-molecular pump 3 as an exhauster, a high-frequency power of 100 MHz is supplied by an antenna use high-frequency power supply 4 to an antenna 5 provided so as to project into the vacuum chamber 1. Then, plasma is generated in the vacuum chamber 1, allowing plasma processing to be carried out with a substrate 7 placed on a substrate electrode 6. There is also provided a substrate-electrode use high-frequency power supply 8 for supplying a high-frequency power of 400 kHz to the substrate electrode 6, making it possible to control ion energy that reaches the substrate 7. The high-frequency power supplied to the antenna 5 is delivered to a proximity to the center of the antenna 5 by a feed bar 9. A plurality of sites of the antenna 5 other than its center and peripheries, and a face 27 of the vacuum chamber 1 opposite to the substrate 7 are short-circuited by short pins 10. A dielectric plate 11 is sandwiched between the antenna 5 and the vacuum chamber 1, and the feed bar 9 and the short pins 10 extend through holes provided in the dielectric plate 11. Further, a slit 14 is provided so as to comprise a recessed or grooved space between the dielectric plate 11 and a dielectric ring 12 provided at a peripheral portion of the dielectric plate 11, and a recessed or grooved space between the antenna 5 and a conductor ring 13 provided at a peripheral portion of the antenna 5.

An inner side face of the slit 14 and the antenna 5 are covered with, for example, a 5 mm thick antenna cover 15 made of quartz glass, a bottom face of the slit 14 is covered with a slit cover 16, and the antenna cover 15 is supported by the slit cover 16, where the slit cover 16 is fixed to a vacuum-chamber wall surface 17 so that the antenna cover 15 is fixed. Also, the slit cover 16 is given by an about 5 mm thick conductor (aluminium coated with alumite), and conduction between the slit cover 16 and the vacuum-chamber wall surface 17 is ensured by a radially elastic and conductive spiral tube 18 made of metal etc.

The turbo-molecular pump 3 and an exhaust port 19 are disposed just under the substrate electrode 6, and a pressure-regulating valve 20 for controlling the vacuum chamber 1 to a specified pressure is an up-and-down valve disposed just under the substrate electrode 6 and just over the turbo-molecular pump 3. The substrate electrode 6 is fixed to the vacuum chamber 1 with four pillars 21.

Figure 2:
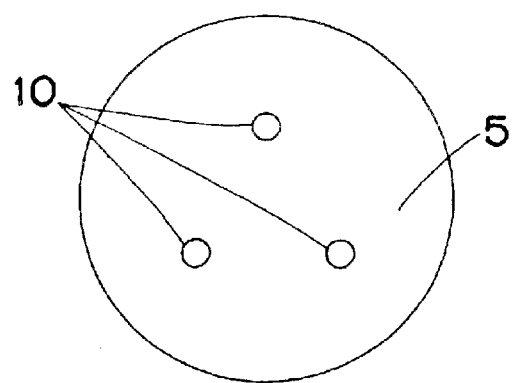
FIG. 2 is a sectional view showing a part of the constitution of the plasma processing apparatus used in the first embodiment of the present invention.

FIG. 2 shows a plan view of the antenna 5. In FIG. 2, the short pins 10 are provided at three sites so as to be equidistantly placed to the center of the antenna 5.

With the plasma processing apparatus described above, when the thickness of alumite of the slit cover was measured before and after an about 1,000 pcs. etching process, an about 10 $\mu$m decrease of film thickness was found. However, by virtue of the slit cover's light weight and low price, plasma processing was able to be continued with the slit cover replaced as a consumption part.

Also, since there are no such singular points as bolt fitting holes at the surface of the antenna cover 15, deposited film resulting from the plasma processing was free from peeling, with the result of almost no dust occurrence.

Next, a second embodiment of the present invention is described with reference to FIG. 3.

Figure 3:
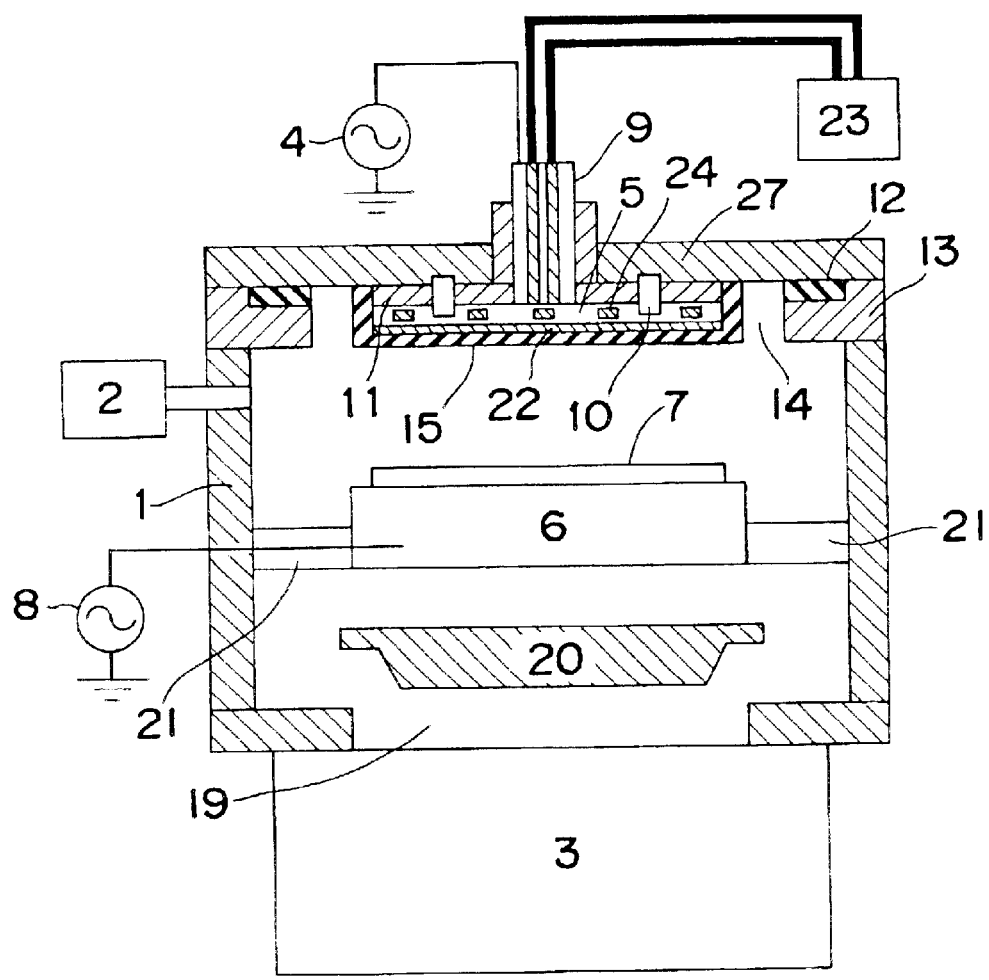
FIG. 3 is a sectional view showing constitution of a plasma processing apparatus used in a second embodiment of the present invention.

FIG. 3 shows a sectional view of a plasma processing apparatus, used in the second embodiment of the present invention, on which a patch-antenna system plasma source is mounted. Referring to FIG. 3, while interior of a vacuum chamber 1 is maintained to a specified pressure by introducing a specified gas from a gas supply unit 2 into the vacuum chamber 1 and simultaneously performing exhaustion by a turbo-molecular pump 3 as an exhauster, a high-frequency power of 100 MHz is supplied by an antenna use high-frequency power supply 4 to an antenna 5. Then, plasma is generated in the vacuum chamber 1, allowing plasma processing to be carried out with a substrate 7 placed on a substrate electrode 6. There is also provided a substrate-electrode use high-frequency power supply 8 for supplying a high-frequency power of 400 kHz to the substrate electrode 6, making it possible to control ion energy that reaches the substrate 7. The high-frequency power supplied to the antenna 5 is delivered to a proximity to the center of the antenna 5 by a feed bar 9. A plurality of sites of the antenna 5 other than its center and peripheries, and a face 27 of the vacuum chamber 1 opposite to the substrate 7 are short-circuited by short pins 10. A dielectric plate 11 is sandwiched between the antenna 5 and the vacuum chamber 1, and the feed bar 9 and the short pins 10 extend through holes provided in the dielectric plate 11. Further, a slit 14 is provided so as to comprise a recessed or grooved space between the dielectric plate 11 and a dielectric ring 12 provided at a peripheral portion of the dielectric plate 11, and a recessed or grooved space between the antenna 5 and a conductor ring 13 provided at a peripheral portion of the antenna 5.

An inner side face of the slit 14 and the antenna 5 are covered with, for example, a 5 mm thick antenna cover 15 made of quartz glass. A 0.2 mm thick heat-conducting sheet 22 made of silicon resin (dielectric loss tangent=0.005) and having such an elasticity as to allow the tolerance is provided between the antenna 5 and the antenna cover 15 as one example, and a refrigerant feed unit 23 such as a pump for making a refrigerant flow to the antenna 5 is provided. In addition, a refrigerant flow passage 24 is formed inside the antenna 5, and inlet and outlet passages for the refrigerant are provided inside the feed bar 9.

The turbo-molecular pump 3 and an exhaust port 19 are disposed just under the substrate electrode 6, and a pressure-regulating valve 20 for controlling the vacuum chamber 1 to a specified pressure is an up-and-down valve disposed just under the substrate electrode 6 and just over the turbo-molecular pump 3. The substrate electrode 6 is fixed to the vacuum chamber 1 with four pillars 21. Planar arrangement of the short pins 10 is the same as in FIG. 2, which has already been described.

With the plasma processing apparatus of the above-described constitution, even after 5-min. plasma processing and 1-min. vacuum holding was repeated 100 times, the temperature of the antenna cover 15 was maintained under 100° C. The reason of this can be considered that the thin heat-conducting sheet 22 was interleaved between the antenna cover 15 and the antenna 5 and that the antenna 5 was cooled by a refrigerant. The silicon resin heat-conducting sheet 22 is soft, making close contact with the antenna 5 and the antenna cover 15, and thin, having a great effect in accelerating heat exchange between the antenna cover 15 and the antenna 5. As a result of carrying out plasma processing while the temperature of the antenna cover 15 was controlled as shown above, there was neither occurrence of dust nor occurrence of cracks of the antenna cover 15.

Next, a third embodiment of the present invention is described with reference to FIG. 4.

Figure 4:
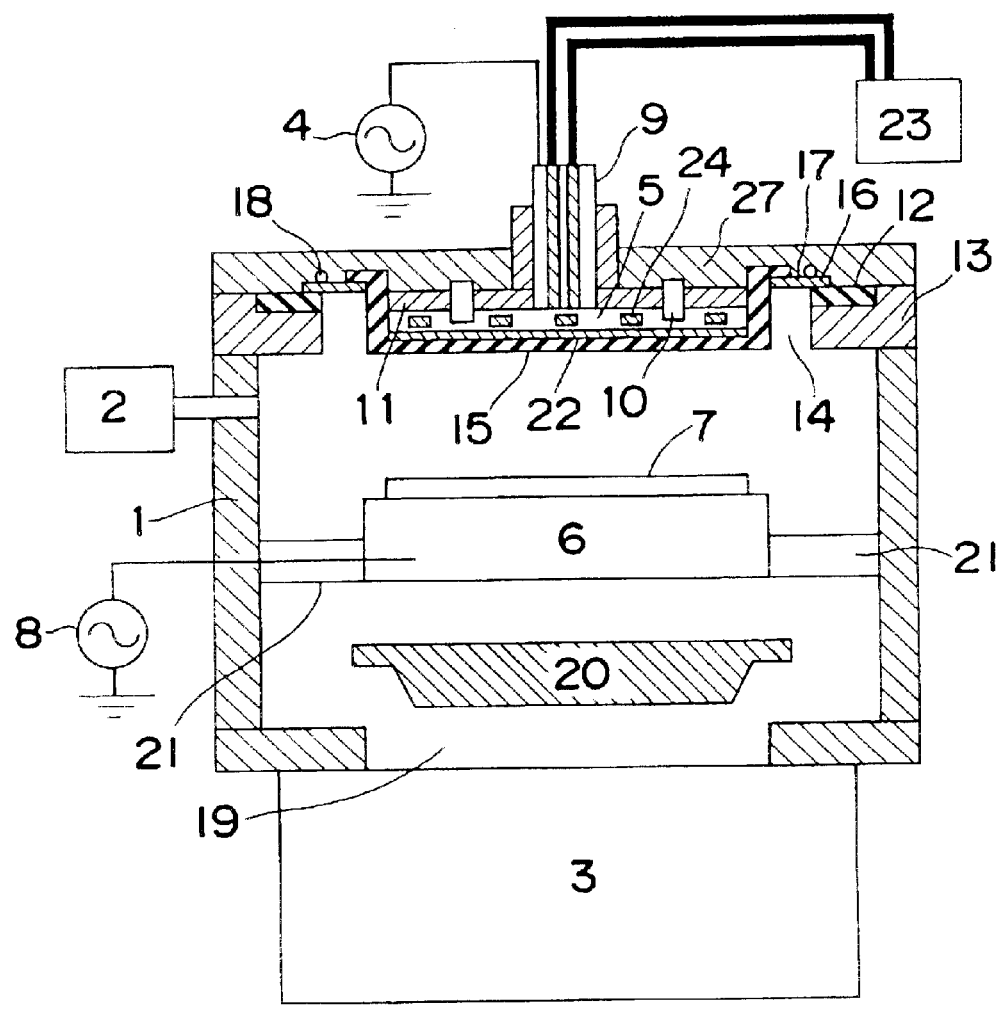
FIG. 4 is a sectional view showing constitution of a plasma processing apparatus used in a third embodiment of the present invention.
Figure 5:
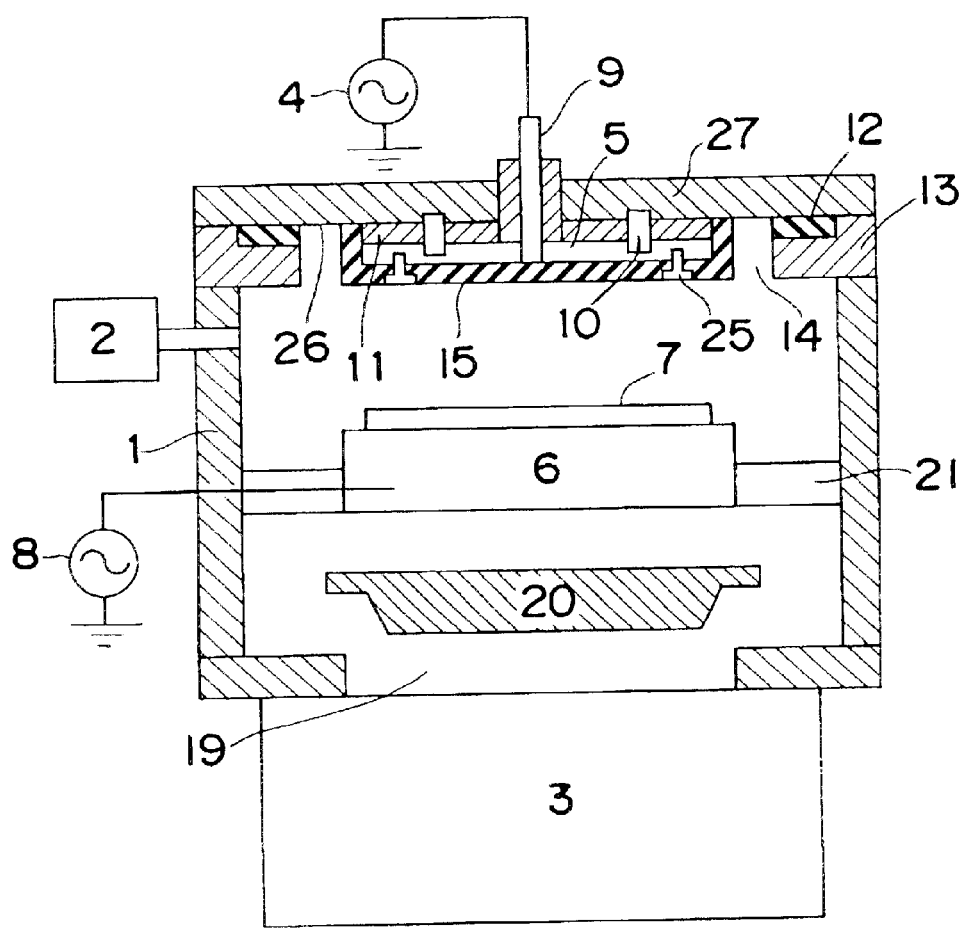
FIG. 5 is a sectional view showing constitution of a plasma processing apparatus used in a prior-art example.

FIG. 4 shows a sectional view of a plasma processing apparatus, used in the third embodiment of the present invention, on which a patch-antenna system plasma source is mounted. Referring to FIG. 4, while interior of a vacuum chamber 1 is maintained to a specified pressure by introducing a specified gas from a gas supply unit 2 into the vacuum chamber 1 and simultaneously performing exhaustion by a turbo-molecular pump 3 as an exhauster, a high-frequency power of 100 MHz is supplied by an antenna use high-frequency power supply 4 to an antenna 5. Then, plasma is generated in the vacuum chamber 1, allowing plasma processing to be carried out with a substrate 7 placed on a substrate electrode 6. There is also provided a substrate-electrode use high-frequency power supply 8 for supplying a high-frequency power of 400 kHz to the substrate electrode 6, making it possible to control ion energy that reaches the substrate 7. The high-frequency power supplied to the antenna 5 is delivered to a proximity to the center of the antenna 5 by a feed bar 9. A plurality of sites of the antenna 5 other than its center and peripheries, and a face 27 of the vacuum chamber 1 opposite to the substrate 7 are short-circuited by short pins 10. A dielectric plate 11 is sandwiched between the antenna 5 and the vacuum chamber 1, and the feed bar 9 and the short pins 10 extend through holes provided in the dielectric plate 11. Further, a slit 14 is provided so as to comprise a recessed or grooved space between the dielectric plate 11 and a dielectric ring 12 provided at a peripheral portion of the dielectric plate 11, and a recessed or grooved space between the antenna 5 and a conductor ring 13 provided at a peripheral portion of the antenna 5.

An inner side face of the slit 14 and the antenna 5 are covered with, for example, a 5 mm thick antenna cover 15 made of quartz glass, a bottom face of the slit 14 is covered with a slit cover 16, and the antenna cover 15 is supported by the slit cover 16, where the slit cover 16 is fixed to a vacuum-chamber wall surface 17 so that the antenna cover 15 is fixed. Also, the slit cover 16 is given by a conductor (aluminium coated with alumite), and electric conduction between the slit cover 16 and the vacuum-chamber wall surface 17 is ensured by a radially elastic and conductive spiral tube 18 made of metal etc.

A 0.2 mm thick heat-conducting sheet 22 made of silicon resin (dielectric loss tangent=0.005) is provided between the antenna 5 and the antenna cover 15 as one example, and a refrigerant feed unit 23 for making a refrigerant flow to the antenna 5 is provided. In addition, a refrigerant flow passage 24 is formed inside the antenna 5, and inlet and outlet passages for the refrigerant are provided inside the feed bar 9.

The turbo-molecular pump 3 and an exhaust port 19 are disposed just under the substrate electrode 6, and a pressure-regulating valve 20 for controlling the vacuum chamber 1 to a specified pressure is an up-and-down valve disposed just under the substrate electrode 6 and just over the turbo-molecular pump 3. The substrate electrode 6 is fixed to the vacuum chamber 1 with four pillars 21. Planar arrangement of the short pins 10 is the same as in FIG. 2, which has already been described.

With the plasma processing apparatus of the above-described constitution, when the thickness of alumite of the slit cover was measured before and after an about 1,000 pcs. etching process, an about 10 μm decrease of film thickness was found. However, by virtue of the slit cover's light weight and low price, plasma processing was able to be continued with the slit cover replaced as a consumption part.

Also, since there are no such singular points as bolt fitting holes at the surface of the antenna cover 15, deposited film resulting from the plasma processing was free from peeling, with the result of almost no dust occurrence.

Further, even after 5-min. plasma processing and 1-min. vacuum holding was repeated 100 times, the temperature of the antenna cover 15 was maintained under 100° C. The reason of this can be considered that the thin heat-conducting sheet 22 was interleaved between the antenna cover 15 and the antenna 5 and that the antenna 5 was cooled by a refrigerant. The silicon resin heat-conducting sheet 22 is soft, making tight contact with the antenna 5 and the antenna cover 15, and thin, having a great effect in accelerating heat exchange between the antenna cover 15 and the antenna 5. As a result of carrying out plasma processing while the temperature of the antenna cover 15 was controlled as shown above, there was neither occurrence of dust nor occurrence of cracks of the antenna cover 15.

The above embodiments of the present invention have exemplified only part of many variations on configuration of the vacuum chamber, structure and arrangement of the plasma source, and the like out of the application range of the present invention. Needless to say, other many variations may be conceived in applying the present invention, other than the examples given above.

The above embodiments of the present invention have been described on a case where the slit cover is a conductor and the conduction between the slit cover and the vacuum-chamber wall surface is ensured by the spiral tube. Ensuring the conduction between the slit cover and the vacuum-chamber wall surface produces advantages that an electromagnetic field excited inside the vacuum chamber is stabilized while occurrence of abnormal discharges can be suppressed. Otherwise, even if the slit cover is an insulating member, similar advantages can be obtained.

Also, the above embodiments of the present invention have been described on a case where the heat-conducting sheet is 0.2 mm thick silicon resin and has a dielectric loss tangent of 0.005. However, the thickness and material of the heat-conducting sheet are not limited to these. Although the heat-conducting sheet is desirably soft so as to be superior in close contactability in order to enhance the heat exchange between the antenna and the antenna cover, excessively thin sheets less than 0.03 mm could not absorb insufficiency of the flatness of the antenna or the antenna cover, and excessively thick sheets more than 3 mm would cause increases in the heat capacity of the heat-conducting sheet itself. Thus, preferably, the thickness of the heat-conducting sheet is generally in a range of 0.03 mm to 3 mm. Further, larger dielectric loss tangents of the heat-conducting sheet might cause occurrence of dielectric loss due to an effect of the high-frequency power supplied to the antenna, giving rise to heat generation and melting of the resin. Therefore, preferably, the dielectric loss tangent is generally more than 0 and not more than 0.01. Also, although the above embodiments have been described on a case where the antenna cover is 5 mm quartz glass, yet it would be possible that the antenna cover is made from other ceramic base materials or insulative silicon. However, ceramic base materials contain not small quantities of impurities, and therefore may cause dust or contamination, thus not so preferable. Using insulative silicon, on the other hand, has an effect of improving the etching selection ratio in the etching process of silicon oxide or other insulating films. Still also, excessively thin antenna covers less than 1 mm would cause insufficiency of mechanical strength, while excessively thick antenna covers more than 10 mm would cause decreases in cooling efficiency due to a heat storage effect. Thus, preferably, the thickness of the antenna cover is generally in a range of 1 mm to 10 mm.

Also, the above embodiments have been described on a case where a high-frequency voltage is delivered to the antenna via a through hole provided at a proximity to the center of the dielectric plate and where the antenna and the vacuum chamber are short-circuited by short pins via through holes provided at a plurality of sites other than the center and peripheries of the dielectric plate and which are equidistantly placed to the center of the antenna. With such an arrangement, isotropy of the plasma can be enhanced. With small substrates or the like, it is needless to say that sufficiently high in-plane uniformity can be obtained without using short pins.

Also, the above embodiments have been described on a case where the frequency of the high-frequency power applied to the antenna is 100 MHz. However, frequencies of 50 MHz to 3 GHz can be used for the patch antenna used in the present invention.

However, the present invention is notably effective for cases where the frequency of the high-frequency power applied to the antenna, in particular, is within a range of 50 MHz to 300 MHz.

Use of frequencies lower than 50 MHz would make it hard to form a high-density plasma region based on hollow cathode discharge by the slit, where the control of plasma density using the slit could not sufficiently be implemented.

With the frequency higher than 300 MHz, conversely, plasma ignition would be hard to turn on.

Also, the above embodiments have been described on a case where the frequency of the high-frequency power supplied to the substrate electrode is 400 kHz. However, needless to say, high-frequency power of other frequencies, e.g. 100 kHz to 100 MHz, can be used for the control of ion energy that reaches the substrate. Otherwise, without the supply of high-frequency power to the substrate electrode, it is also possible to carry out plasma processing with weak ion energy by making use of a slight difference between plasma potential and substrate potential.

Galden can be used as an example of the refrigerant. Galden is a fluorine-based solution called perfluoropolyether. Galden is a very common refrigerant, and it seems needless to mention any examples of its manufacturers (ex. Ausimont company, Italy). Galden is low in vapor pressure and poor at volatility, requiring no frequent resupply. Galden is low in chemical reactivity, allowing safe handling.

It is also possible to use water as the refrigerant. In particular, DIW (De-Ionized Water) is widely used. Using DIW produces an effect of less deposition of contaminations inside the piping (compared with tap water).

As apparent from the above description, according to the first aspect of the present invention, there is provided a plasma processing method for generating plasma in a vacuum chamber and processing a substrate placed on a substrate electrode, the plasma being generated by supplying a high-frequency power having a frequency of 50 MHz to 3 GHz to an antenna provided opposite to the substrate electrode while interior of the vacuum chamber is controlled to a specified pressure by supplying a gas into the vacuum chamber and exhausting the interior of the vacuum chamber, the method comprising: with a dielectric plate being sandwiched between the antenna and the vacuum chamber and both the antenna and the dielectric plate projecting into the vacuum chamber, controlling plasma distribution on the substrate with an annular and recessed slit provided between the antenna and the vacuum chamber; and processing the substrate in a state where the antenna cover is fixed by making both an inner side face of the slit and the antenna covered with an antenna cover, making a bottom face of the slit covered with a slit cover, supporting the antenna cover by the slit cover, and fixing the slit cover to a wall surface of the vacuum chamber. Therefore, a plasma processing method which is less liable to occurrence of dust can be provided.

Also, according to the second aspect of the present invention, there is provided a plasma processing method for generating plasma in a vacuum chamber and processing a substrate placed on a substrate electrode within the vacuum chamber, the plasma being generated by supplying a high-frequency power having a frequency of 50 MHz to 3 GHz to an antenna provided opposite to the substrate electrode while interior of the vacuum chamber is controlled to a specified pressure by supplying a gas into the vacuum chamber and exhausting the interior of the vacuum chamber, the method comprising: with a dielectric plate being sandwiched between the antenna and the vacuum chamber and both the antenna and the dielectric plate projecting into the vacuum chamber, controlling plasma distribution on the substrate by an annular and recessed slit provided between the antenna and the vacuum chamber; and processing the substrate while controlling temperature of the antenna by making both an inner side face of the slit and the antenna covered with an antenna cover and applying a refrigerant flow to the antenna while ensuring heat conduction between the antenna and the antenna cover by a heat-conducting sheet provided between the antenna and the antenna cover. Therefore, a plasma processing method which is less liable to occurrence of dust and cracks of the antenna cover can be provided.

Also, according to the third aspect of the present invention, there is provided a plasma processing apparatus comprising:

a vacuum chamber;

a gas supply unit for supplying gas into the vacuum chamber;

an exhausting unit for exhausting interior of the vacuum chamber;

a pressure-regulating valve for controlling the interior of the vacuum chamber to a specified pressure;

a substrate electrode for placing thereon a substrate within the vacuum chamber;

an antenna provided opposite to the substrate electrode; and high-frequency power supply capable of supplying a high-frequency power having a frequency of 50 MHz to 3 GHz to the antenna, the plasma processing apparatus further comprising:

a dielectric plate sandwiched between the antenna and the vacuum chamber, both the antenna and the dielectric plate projecting into the vacuum chamber;

an antenna cover for covering both an inner side face of an annular and recessed slit and the antenna with the slit provided between the antenna and the vacuum chamber; and a slit cover for covering a bottom face of the slit and supporting the antenna cover, where the slit cover is fixed to a wall surface of the vacuum chamber so that the antenna cover is fixed. Therefore, a plasma processing apparatus which is less liable to occurrence of dust can be provided.

Also, according to the fourth aspect of the present invention, there is provided a plasma processing apparatus comprising:

a vacuum chamber;

a gas supply unit for supplying gas into the vacuum chamber;

an exhausting unit for exhausting interior of the vacuum chamber;

a pressure-regulating valve for controlling the interior of the vacuum chamber to a specified pressure;

a substrate electrode for placing thereon a substrate within the vacuum chamber;

an antenna provided opposite to the substrate electrode; and high-frequency power supply capable of supplying a high-frequency power having a frequency of 50 MHz to 3 GHz to the antenna, the plasma processing apparatus further comprising:

a dielectric plate sandwiched between the antenna and the vacuum chamber, both the antenna and the dielectric plate projecting into the vacuum chamber;

an antenna cover for covering both an inner side face of an annular and recessed slit and the antenna with the slit provided between the antenna and the vacuum chamber;

a heat-conducting sheet provided between the antenna and the antenna cover; and a refrigerant feed unit for making a refrigerant flow to the antenna. Therefore, a plasma processing apparatus which is less liable to occurrence of dust and cracks of the antenna cover can be provided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:

a vacuum chamber;

a gas supply unit for supplying gas into the vacuum chamber;

an exhausting unit for exhausting interior of the vacuum chamber;

a pressure-regulating valve for controlling the interior of the vacuum chamber to a specified pressure;

a substrate electrode for placing thereon a substrate within the vacuum chamber;

an antenna provided opposite to the substrate electrode; and high-frequency power supply capable of supplying a high-frequency power having a frequency of 50 MHz to 3 GHz to the antenna, the plasma processing apparatus further comprising:

a dielectric plate sandwiched between the antenna and the vacuum chamber, both the antenna and the dielectric plate projecting into the vacuum chamber;

an antenna cover for covering both an inner side face of an annular and recessed slit and the antenna with the slit provided between the antenna and the vacuum chamber; and a slit cover for covering a bottom face of the slit and supporting the antenna cover, where the slit cover is fixed to a wall surface of the vacuum chamber so that the antenna cover is fixed.

2. A plasma processing apparatus according to claim 1, wherein the slit cover is a conductor and electric conduction between the slit cover and the vacuum-chamber wall surface is ensured by a spiral tube.

3. A plasma processing apparatus according to claim 1, wherein the slit cover is a dielectric substance.

4. A plasma processing apparatus according to claim 1, wherein the antenna cover is made of 1 mm to 10 mm thick quartz glass.

5. A plasma processing apparatus according to claim 1, wherein the antenna cover is made of 1 mm to 10 mm thick insulative silicon.

6. A plasma processing apparatus according to claim 1, wherein the frequency of the high-frequency power supplied to the antenna is within a range of 50 MHz to 300 MHz.

* * * * *